United States Patent
Lukaitis et al.

(10) Patent No.: US 8,541,864 B2
(45) Date of Patent: Sep. 24, 2013

(54) COMPACT THERMALLY CONTROLLED THIN FILM RESISTORS UTILIZING SUBSTRATE CONTACTS AND METHODS OF MANUFACTURE

(75) Inventors: Joseph M. Lukaitis, Pleasant Valley, NY (US); Jed H. Rankin, Richmond, VT (US); Robert R. Robison, Colchester, VT (US); Dustin K. Slisher, Wappingers Falls, NY (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/588,218

(22) Filed: Aug. 17, 2012

(65) Prior Publication Data

US 2012/0313215 A1 Dec. 13, 2012

Related U.S. Application Data

(62) Division of application No. 13/008,465, filed on Jan. 18, 2011, now Pat. No. 8,298,904.

(51) Int. Cl.
 *H01L 29/02* (2006.01)
(52) U.S. Cl.
 USPC ................................. 257/506; 257/E29.02
(58) Field of Classification Search
 USPC ........................................... 257/506, E29.02
 See application file for complete search history.

(56) References Cited

U.S. PATENT DOCUMENTS

| | | |
|---|---|---|
| 5,640,137 A | 6/1997 | Mantha |
| 5,793,097 A | 8/1998 | Shimamoto |
| 6,563,214 B2 | 5/2003 | Yamada et al. |
| 7,253,074 B2 | 8/2007 | Park |
| 7,365,397 B2 | 4/2008 | Nomura |
| 7,375,001 B2 | 5/2008 | Hasegawa |
| 2001/0026968 A1 | 10/2001 | Sung et al. |
| 2003/0219956 A1 | 11/2003 | Mori et al. |
| 2004/0152268 A1 | 8/2004 | Chu et al. |
| 2005/0106805 A1 | 5/2005 | Olson |
| 2011/0057267 A1 | 3/2011 | Chuang et al. |
| 2011/0073957 A1 | 3/2011 | Chiu et al. |
| 2012/0181663 A1 | 7/2012 | Lukaitis et al. |

FOREIGN PATENT DOCUMENTS

| | | |
|---|---|---|
| JP | 2283058 | 11/1990 |
| JP | 3171657 | 7/1991 |
| JP | 3248458 | 11/1991 |
| JP | 7142677 | 6/1995 |
| JP | 2000150780 | 5/2000 |
| JP | 2001257317 | 9/2001 |

OTHER PUBLICATIONS

Office Action dated May 29, 2013 in U.S. Appl. No. 13/008,459; 10 pages.

*Primary Examiner* — Alexander Ghyka
*Assistant Examiner* — Stanetta Isaac
(74) *Attorney, Agent, or Firm* — David Cain; Roberts Mlotkowski Safran & Cole, P.C.

(57) ABSTRACT

A method of forming a semiconductor structure includes forming a resistor on an insulator layer over a substrate, and forming at least one dielectric layer over the resistor. The method also includes forming a substrate contact through the at least one dielectric layer, through the resistor, through the insulator layer, and into the substrate. The substrate contact comprises a high thermal conductivity material.

10 Claims, 10 Drawing Sheets

COMPACT THERMALLY CONTROLLED THIN FILM RESISTORS UTILIZING SUBSTRATE CONTACTS AND METHODS OF MANUFACTURE

CROSS-REFERENCE TO RELATED APPLICATIONS

The present application is a divisional of U.S. application Ser. No. 13/008,465 filed Jan. 18, 2011, the contents of which are expressly incorporated by reference herein in their entirety

FIELD OF THE INVENTION

The invention relates to semiconductor structures and methods of manufacture and, more particularly, to thermal control of thin film resistors using substrate contacts and methods of manufacture.

BACKGROUND

Specific structures on silicon-on-insulator (SOI) substrates tend to have problems with heat accumulation from self-heating due to the very low thermal conductivity of the SOI substrate. This presents particular issues with the maximum allowed current density of thermally sensitive structures. The heat accumulation presents particular problems with DC structures such as, for example, some precision resistors (e.g., thin film resistors).

Precision resistors are in general use in Si-based microelectronics integrated circuit chips. These resistors are frequently fabricated from polysilicon layers deposited on the chip, but they can also be made from diffused silicon (Si) layers in SOI wafers. These resistors produce heat when current flows through them. In particular, polysilicon and diffused resistors, especially those formed on SOI wafers, heat up rapidly with increasing current density. Although the resistor itself can tolerate relatively high temperatures without suffering damage, wiring on the various metallization levels above and nearby the resistors becomes much more vulnerable to failure by electromigration due to the heating caused by the resistor. Generally, a temperature increase of 5° C. in a metal line can decrease the lifetime of the line by 25 to 30%. The generated heat can also permanently alter the value of the resistance of the resistor by changing the grain size of the polysilicon, by burning out portions (or all) of the film and by redistributing the dopant atoms. Consequently, limiting the current through the resistor protects both the resistor stability and the integrity of the nearby metallization.

However, limiting the current through a resistor is at odds with the continued drive toward circuit miniaturization and the trend toward progressively greater current densities for high-performance circuits. The miniaturization of features typically involves reducing the film thickness in which resistors are formed, which tends to increase current density, which causes the resistor to generate more heat.

Accordingly, there exists a need in the art to overcome the deficiencies and limitations described hereinabove.

SUMMARY

In a first aspect of the invention, a method of forming a semiconductor structure comprises forming a resistor on an insulator layer over a substrate, and forming at least one dielectric layer over the resistor. The method also comprises forming a substrate contact through the at least one dielectric layer, through the resistor, through the insulator layer, and into the substrate. The substrate contact comprises a high thermal conductivity material.

In another aspect of the invention a method of forming a semiconductor structure comprises forming a resistor on an insulator layer over a substrate, and forming a resistor trench in the resistor. The method also comprises forming a dielectric layer on the resistor and in the resistor trench, and forming a substrate contact through the dielectric layer, through the insulator layer, and into the substrate. The substrate contact comprises a high thermal conductivity material.

In yet another aspect of the invention, a semiconductor structure comprises a resistor on an insulator layer over a substrate, and at least one dielectric layer over the resistor. The structure also comprises a substrate contact extending through the at least one dielectric layer, through the resistor, through the insulator layer, and into the substrate. The substrate contact comprises a high thermal conductivity material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a resistor and substrate contact, which comprises the structures of the present invention. In still further embodiments, a method in a computer-aided design system is provided for generating a functional design model of the resistor and substrate contact. The method comprises generating a functional representation of the structural elements of the resistor and substrate contact.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to thermal control of thin film resistors using substrate contacts and methods of manufacture. In accordance with aspects of the invention, a substrate contact is formed through the body of the resistor. In embodiments, the substrate contact is electrically isolated from the resistor and provides a low thermal resistance heat path from the resistor to the substrate. In implementations, the substrate contact comprises a liner composed of an electrical insulator material and a core composed of a high thermal conductivity material. In this manner, implementations of the invention provide a low thermal resistance heat dissipation path from a resistor to a substrate, which enhances the thermal control (e.g., cooling) of the resistor.

Resistive heating is a physical consequence of electric current passing through the material of a resistor. Polysilicon resistors typically reside on an insulator layer (e.g., $SiO_2$ or similar material) above an Si substrate. Heat generated in the resistor spreads by thermal conduction into the surrounding oxide and from the oxide into the Si substrate. Heat generated during resistive heating may flow directly through the oxide between the resistor and the substrate. The heat may also flow out of the top and the side edges of the resistor. As such, there are top, side, and bottom heat conduction paths from the resistor. Most of the heat generated in a resistor flows into the Si substrate through the underlying shallow trench isolation (STI) and buried oxide (BOX) films. Heat that flows upward is typically dissipated by flowing laterally and then back to the substrate, which constitutes a much more thermally resistive path than simply flowing out beneath the resistor.

Implementations of the invention provide a heat dissipation path from the resistor to the substrate by providing a substrate contact through an active area of the resistor and into the substrate. In accordance with aspects of the invention, the substrate contact comprises a high thermal conductivity material having a lower thermal resistance than the STI and/or BOX materials that heat typically flows through when dissipating from a resistor. The substrate contact need not be electrically connected to any other devices in the chip, and may be used primarily as a heat conduction pathway for transferring heat away from the resistor. In embodiments, the substrate contact provides a thermal conduction path from the resistor to the substrate, and thus reduces the resistor temperature significantly. In this manner, a resistor may be cooled more effectively, which advantageously permits the current density in the resistor to be increased.

Figure 1:
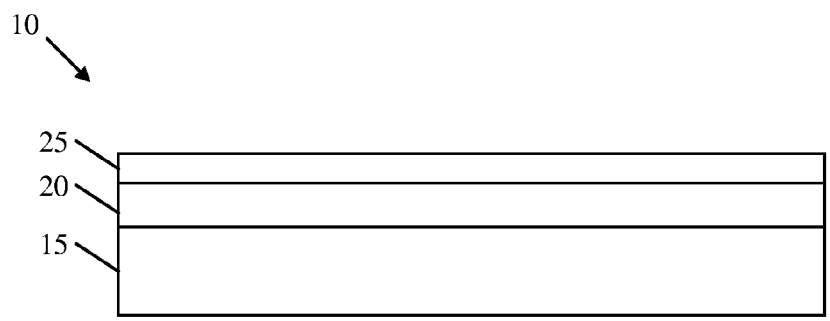
FIGS. 1-13 show processing steps and structures in accordance with aspects of the invention.

FIGS. 1-13 show processing steps and structures in accordance with aspects of the invention. Specifically, FIG. 1 shows an exemplary SOI wafer 10 employed as an intermediate structure in implementations of the invention. The SOI wafer 10 has a bulk semiconductor substrate 15, which is typically a silicon substrate, a buried insulator layer 20 formed on the substrate 15, and a semiconductor layer 25, which is typically a silicon layer, formed on the buried insulator layer 20. The SOI wafer 10 may be fabricated using techniques well know to those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 15 may be composed of any suitable material including, but not limited to, Si, SiGe, SiGeC, SiC, GE alloys, GaAs, InAs, InP, and other III/V or II/VI compound semiconductors. The buried insulator layer 20 may be composed of oxide, such as $SiO_2$, and may be referred to as a buried oxide (BOX) layer 20. Moreover, although the SOI wafer is referred to as "silicon on insulator," the semiconductor layer 25 is not limited to silicon. Instead, the semiconductor layer 25 may be comprised of various semiconductor materials, such as, for example, Si, SiGe, SiC, SiGeC, etc.

In embodiments, the SOI wafer 10 has a thickness of about 700 μm, with the BOX layer 20 having a thickness of about 0.15 μm, and the semiconductor layer 25 having a thickness of about 0.08 μm. However, the invention is not limited to these dimensions, and the various portions of the SOI wafer may have any desired thicknesses based upon the intended use of the final semiconductor device.

Figure 2:
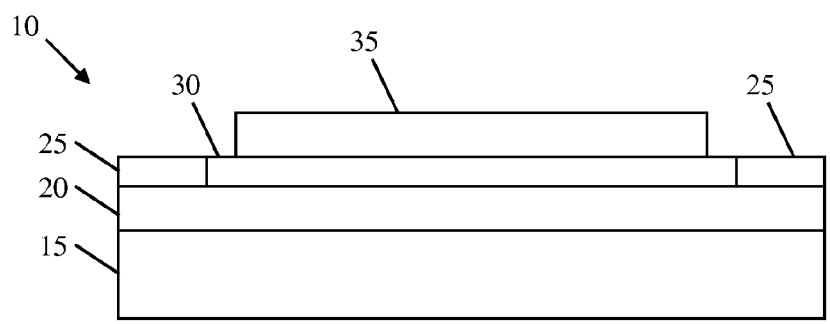

As shown in FIG. 2, a shallow trench isolation (STI) structure 30 is formed in the wafer 10, and a resistor 35 is formed on the STI 30. The STI 30 may be a conventional shallow trench isolation structure formed using conventional semiconductor fabrication processes and materials. For example, the STI 30 may be formed by arranging a photoresist material on the semiconductor layer 25, exposing and developing the photoresist, etching an STI trench in the semiconductor layer 25 through the patterned photoresist (e.g., using a reactive ion etch (RIE) process), stripping the photoresist, filling the trench with an STI material (e.g., $SiO_2$), and planarizing the top surface of the structure (e.g., via chemical mechanical polish (CMP)). The STI 30 locally replaces a portion of the semiconductor layer 25.

Still referring to FIG. 2, the resistor 35 may also be formed using conventional semiconductor fabrication processes and materials. For example, the resistor 35 may comprise electrically conductive doped polysilicon and may be formed by depositing a polysilicon film on the STI 30 (e.g., using chemical vapor deposition (CVD)), patterning the polysilicon film (e.g., using photolithographic masking and etching), and doping the polysilicon film (e.g., using ion implantation, gas diffusion doping, in-situ doping, etc.).

Figure 3:
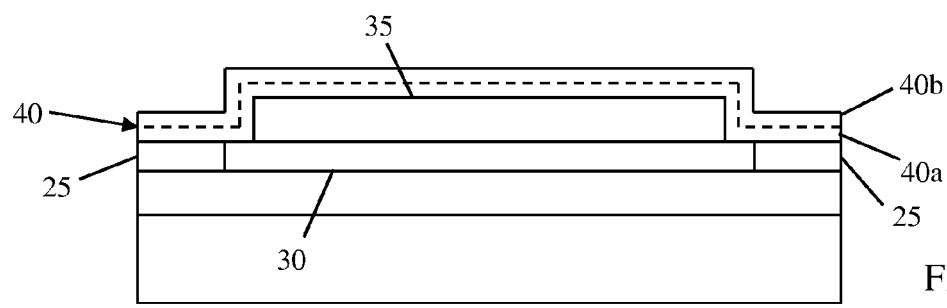

As shown in FIG. 3, a first dielectric layer 40 is formed over the resistor 35 and portions of the semiconductor layer 25 and STI 30. The first dielectric layer 40 may be formed using conventional semiconductor fabrication processes and materials. For example, the first dielectric layer 40 may comprise one or more layers of oxide, nitride, and oxynitride that are formed using, e.g., CVD. In embodiments, the first dielectric layer 40 comprises a thin oxide film 40a formed on the resistor 35 and portions of the semiconductor layer 25 and STI 30, and a nitride layer 40b deposited on the oxide film 40a. The oxide film 40a may have a thickness of about 3 nm, and the nitride layer 40b may have a thickness of about 20-30 nm, although the invention is not limited to these dimensions and any suitable thicknesses may be employed within the scope of the invention.

Figure 4:
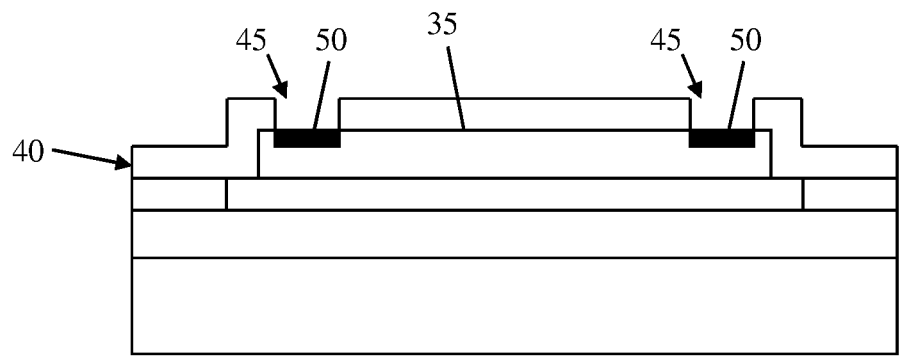

As shown in FIG. 4, holes 45 are formed in the first dielectric layer 40, and silicide contacts 50 are formed on the resistor 35. The holes 45 are formed in the first dielectric layer 40 to define locations for the silicide contacts 50. The holes 45 and silicide contacts 50 may be formed using conventional semiconductor fabrication processes and materials. For example, the holes 45 may be formed in any suitable manner, including photolithographic masking and etching, laser ablation, gas cluster ion beam, etc. The silicide contacts 50 may be formed by depositing a metal film, such as cobalt, titanium, tungsten, or nickel, on the exposed polysilicon of the resistor 35 within the holes 45, and annealing the structure to create silicide.

Figure 5:
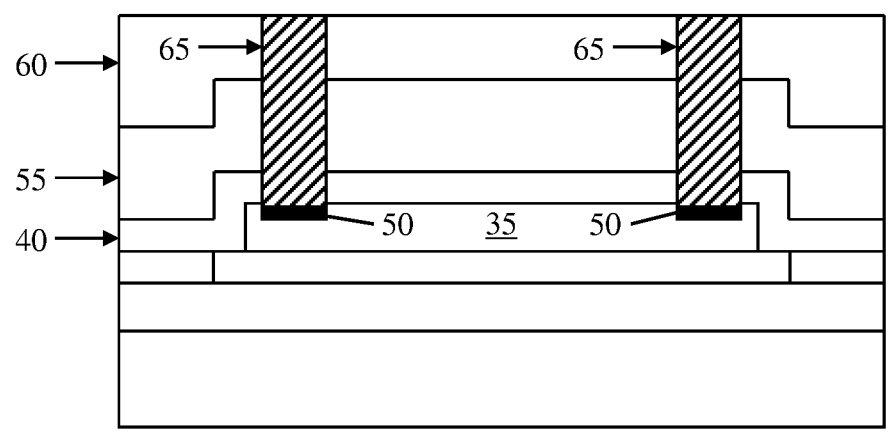

As shown in FIG. 5, a second dielectric layer 55 is formed on the exposed surfaces of the structure, a third dielectric layer 60 is formed on the second dielectric layer 55, and contacts 65 are formed in the layers 40, 55, and 60. The second and third dielectric layers 55 and 60 may be composed of any suitable dielectric materials and may be formed using conventional semiconductor fabrication techniques, such as CVD. In embodiments, the second dielectric layer 55 is composed of nitride, and the third dielectric layer 60 is composed of silicon dioxide ($SiO_2$), borophosphosilicate glass (BPSG), or low-k dielectric material; however, the invention is not limited to this configuration and other combinations of materials may be used within the scope of the invention.

The contacts 65 provide electrical contact to the resistor 35 by directly contacting the silicide contacts 50. The contacts 65 may be formed by forming trenches in the dielectric layers 40, 55, and 60 to expose the silicide contacts 50, and filling the trenches with an electrically conductive material. For example, trenches for the contacts 65 may be formed in the dielectric layers 40, 55, and 60 by masking the structure and etching unmasked portions of the dielectric layers 40, 55, and 60 using one or more conventional etch processes (e.g., RIE). For example, a respective RIE process may be performed for etching each of the dielectric layers 40, 55, and 60, with each respective RIE process being tailored to the material of the layer being etched. Alternatively, a single RIE process may be used to etch more than one layer. The contacts 65, in turn, may be formed by depositing (e.g., using CVD) an electrically conductive material (e.g., tungsten) in the trenches. In embodiments, the contacts 65 may be in the form of a plurality of vias (e.g., an array of small pillars with a minimum diameter dependent on the technology, for example 0.25 µm in diameter) or in the form of a solid bar.

In accordance with aspects of the invention, the use of multiple dielectric layers (e.g., dielectric layers 40, 55, and 60) facilitates the simultaneous creation of the contacts 65. The multiple dielectric layer overlap causes the etch of the contact trenches to self arrest, such that the etch does not etch through the whole nitride stack. Moreover, using nitride in dielectric layers 40 and 55 enhances the heat conduction since nitride is generally a better thermal conductor than oxide.

Figure 6:
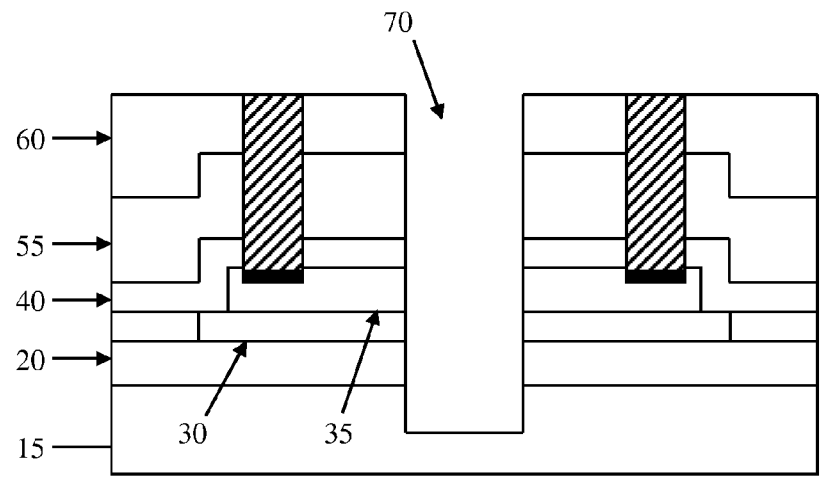

In accordance with aspects of the invention, and as shown in FIG. 6, a substrate contact trench 70 is formed in the dielectric layers 40, 55, and 60, the resistor 35, the STI 30, the BOX layer 20, and into the substrate 15. In embodiments, the substrate contact trench 70 is formed using one or more RIE processes. For example, a respective RIE process may be performed for etching each of the dielectric layers 40, 55, and 60, the resistor 35, the STI 30, the BOX layer 20, and the substrate 15, with each respective RIE process being tailored to the material of the layer/feature being etched. Additionally, a single RIE process may be used to etch more than one layer/feature. For example, in embodiments, the first and second dielectric layers 40 and 55 comprise nitride, and a single RIE process may be used to etch the substrate contact trench 70 in these layers.

The substrate contact trench 70 may have any desired size and shape, and more than one substrate contact trench 70 may be formed. In accordance with aspects of the invention, the substrate contact trench 70 may be located anywhere within or overlapping the footprint (e.g., top-down plan view) of the resistor 35. In embodiments, the substrate contact trench 70 creates a hole through the resistor 35, but does not bisect the resistor 35.

Figure 7:
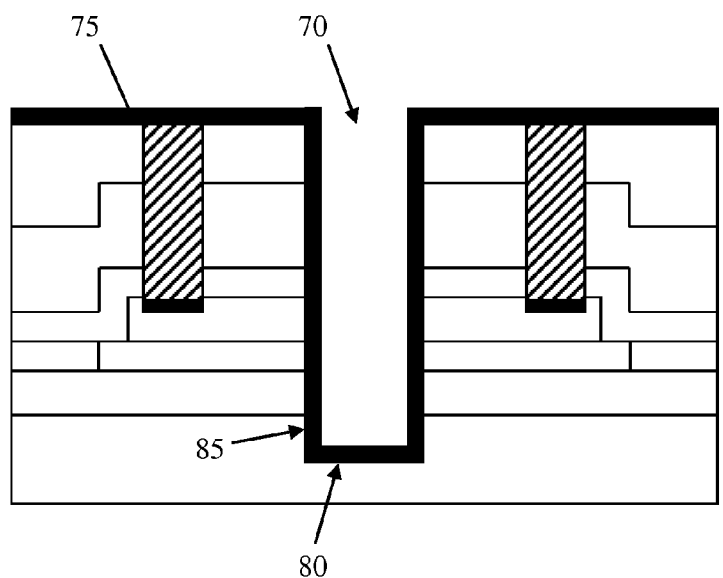

As shown in FIG. 7, an insulator film 75 (e.g., liner) is formed on exposed surfaces of the structure, including a base 80 and sidewalls 85 of the substrate contact trench 70. In embodiments, the insulator film 75 is composed of an electrically non-conductive material, such as oxide, nitride, oxynitride, or other dielectric material. The insulator film 75 may be formed using conventional semiconductor fabrication processes, depending on the material composition of the insulator film 75. For example, the insulator film 75 may be composed of oxide that is thermally grown (e.g., thermal oxidation) on the exposed surfaces of the structure. In another example, the insulator film 75 may be composed of oxide, nitride, or oxynitride that is deposited using CVD or other suitable conformal deposition process. The insulator film 75 may have any suitable thickness, as described in greater detail herein.

Figure 8:
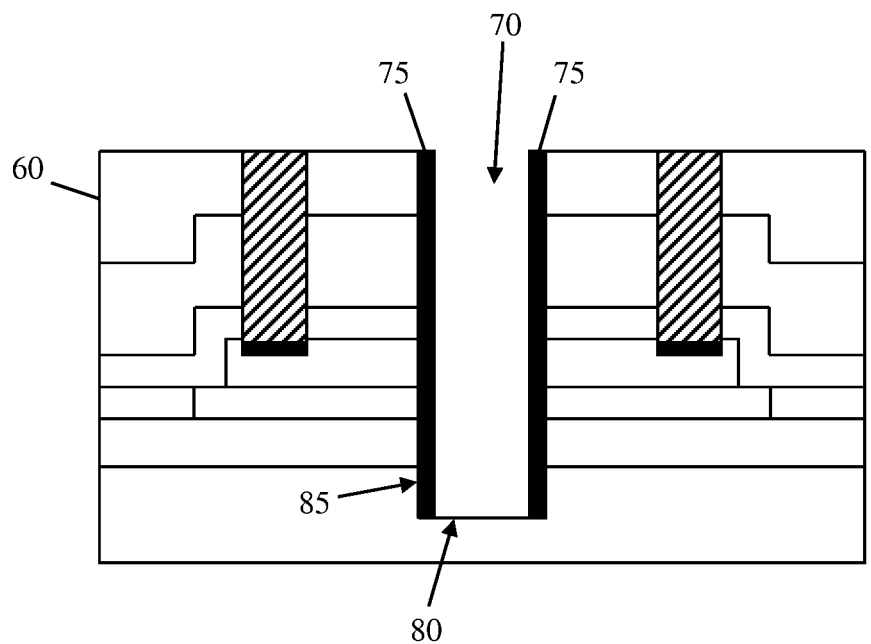

As shown in FIG. 8, and in accordance with aspects of the invention, a portion of the insulator film 75 is removed from the base 80 of the substrate contact trench 70, while leaving another portion of the insulator film 75 on the sidewalls 85 of the substrate contact trench 70. In embodiments, a directional RIE process is used to remove the portion of the insulator film 75 from the base 80; however, other suitable removal processes may be used within the scope of the invention. The removal process may also remove the insulator film 75 from the top of the third dielectric layer 60.

Figure 9:
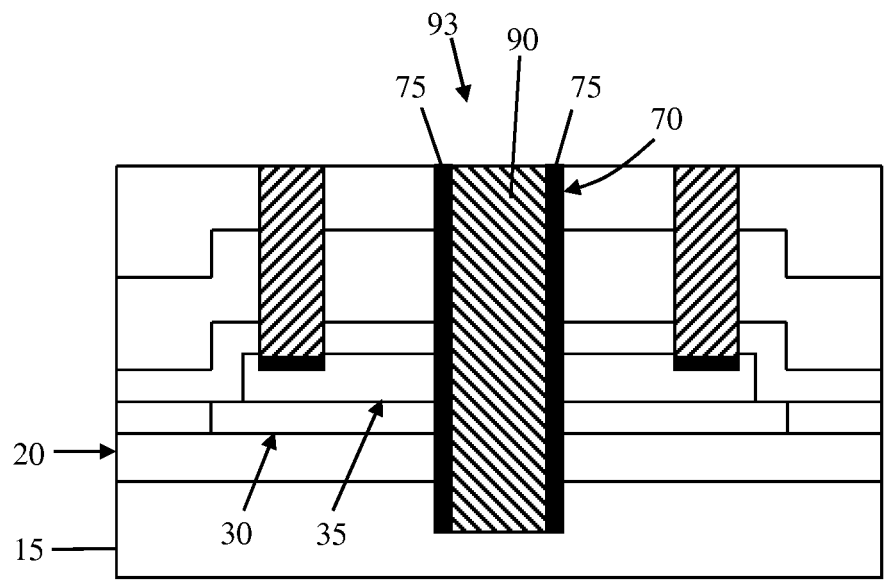

As shown in FIG. 9, a core 90 is formed in the substrate contact trench 70 on the insulator film 75. In accordance with aspects of the invention, the core 90 comprises a high thermal conductivity material including, but not limited to, polysilicon, tungsten, copper, aluminum, silver, gold, and combinations thereof. In embodiments, the core 90 is composed of polysilicon and is formed using a CVD process, although other high thermal conductivity materials may be provided using other formation processes. More specifically, according to aspects of the invention, the core 90 is composed of any suitable material that has a thermal conductivity that is substantially greater than the thermal conductivity of the material(s) of the BOX layer 20 and STI 30 (e.g., $SiO_2$). Table 1 shows the thermal conductivity of various materials.

TABLE 1

| Material | Thermal Conductivity (w/m · K) |
|---|---|
| Glass (e.g., $SiO_2$) | 1.1 |
| Silicon | 149 |
| Tungsten | 173 |
| Aluminum (pure) | 237 |
| Gold | 318 |
| Copper | 401 |
| Silver | 429 |

As is evident from Table 1, polysilicon (e.g., silicon), tungsten, copper, aluminum, silver, and gold each has a thermal conductivity substantially greater than that of $SiO_2$, and thus may be considered as high thermal conductivity materials. Accordingly, in embodiments, the core 90 is composed of polysilicon, tungsten, copper, aluminum, silver, gold, or combinations thereof. In accordance with aspects of the invention, the substrate contact trench 70 that is filled with the insulator film 75 and the core 90 constitutes a substrate contact 93 that provides a heat conduction pathway from the resistor 35 to the substrate 15.

Still referring to FIG. 9, the deposition of the core 90 may result in the formation of excess material on the upper surface of the third dielectric layer 60. The excess material may be removed using a conventional process, such as an endpoint etch or CMP process.

Figure 10:
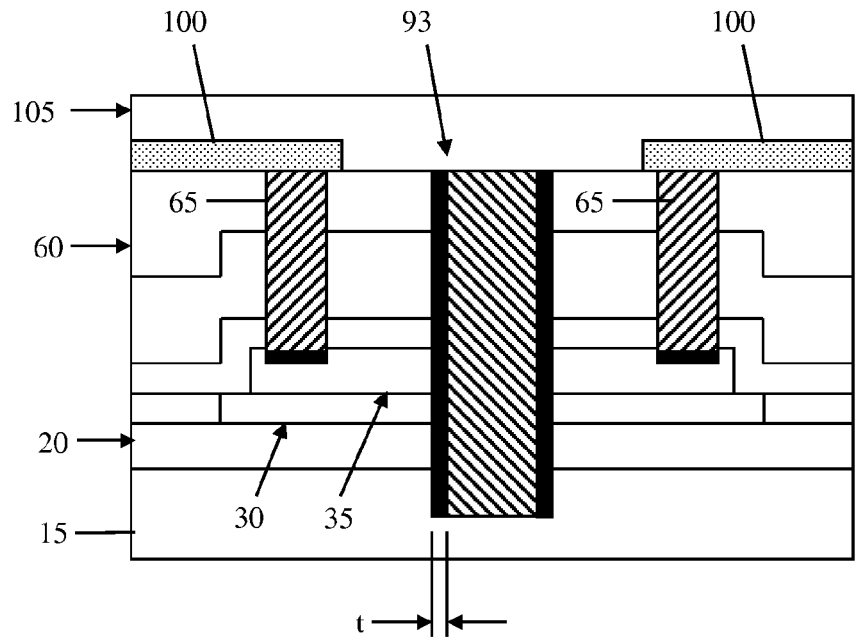

As shown in FIG. 10, metal layer 100 is formed on the third dielectric layer 60 and in contact with the contacts 65, and an interlevel dielectric (ILD) 105 is formed over the entire structure. The metal layer 100 may be formed in any conventional manner, such as, for example, CVD and patterning. The metal layer 100 may be a layer of copper (Cu) or any other desired electrically conductive material, and provides electrical communication to the resistor 35 without contacting the substrate contact 93. The ILD 105 may be formed using conventional semiconductor fabrication techniques, and may be composed of any suitable dielectric material, such as silicon dioxide ($SiO_2$), tetraethylorthosilicate (TEOS), borophosphosilicate glass (BPSG), hydrogen silsesquioxane (HSQ), etc.

Figure 11:
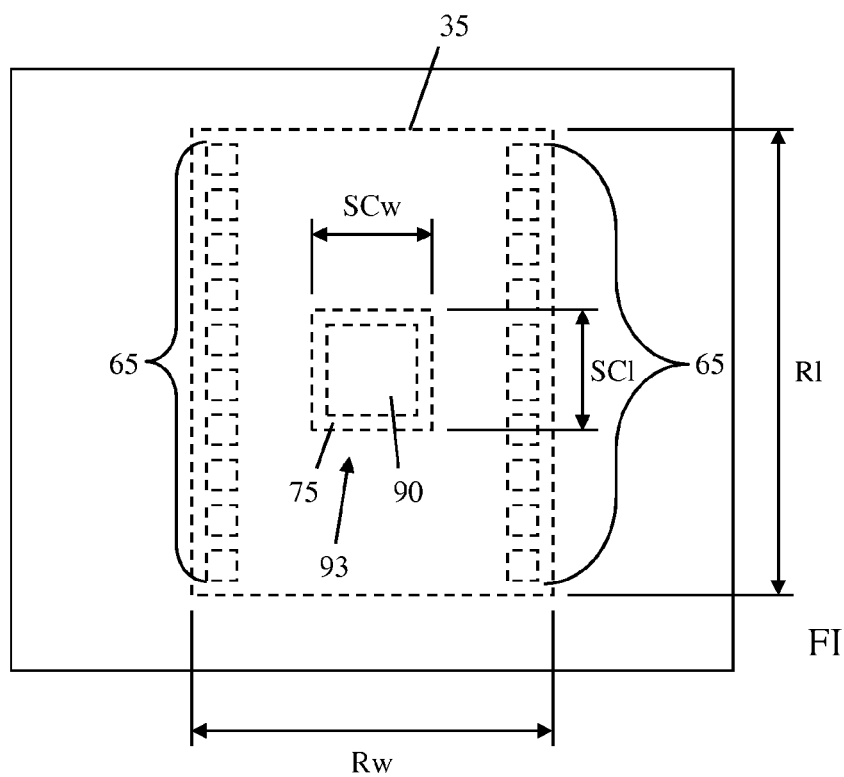

FIG. 11 shows a plan view (not to scale) corresponding to the structure of FIG. 10 with the resistor 35, contacts 65, and substrate contact 93 shown in dashed lines. It can be seen in FIGS. 10 and 11 that the substrate contact 93 is in direct contact with the resistor 35, such that the substrate contact 93 forms a heat conduction path from the resistor 35 to the substrate 15.

In accordance with aspects of the invention, the insulator film 75 electrically insulates the resistor 35 from the core 90, such that an electrically conductive material may be used as the high thermal conductivity material in the core 90 without shorting the resistor 35. In embodiments, the insulator film 75 has a thickness that is sufficient to provide electrical insulation between the resistor 35 and the core 90, and that is less than the combined thickness of the STI 30 and BOX layer 20. By being less thick (e.g., thinner) than the STI 30 and BOX layer 20, the insulator film 75 provides less thermal resistance than the STI 30 and BOX layer 20, such that heat may flow through the insulator film 75 and core 90 and into the substrate 15. In particular embodiments, the insulator film 75 has a thickness "t" of about 0.03 μm to about 0.1 μm, although the invention is not limited to this range and any suitable thickness may be used.

Figure 12:
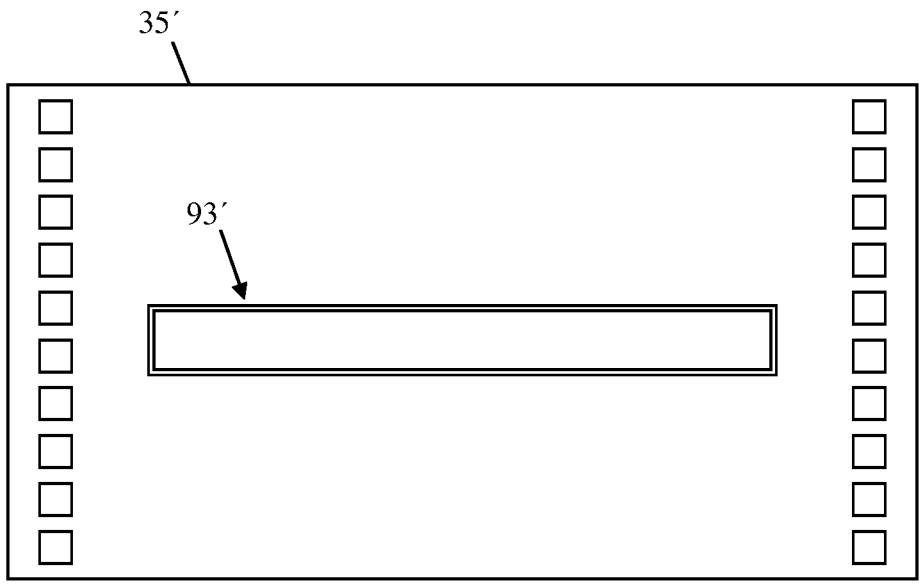
Figure 13:
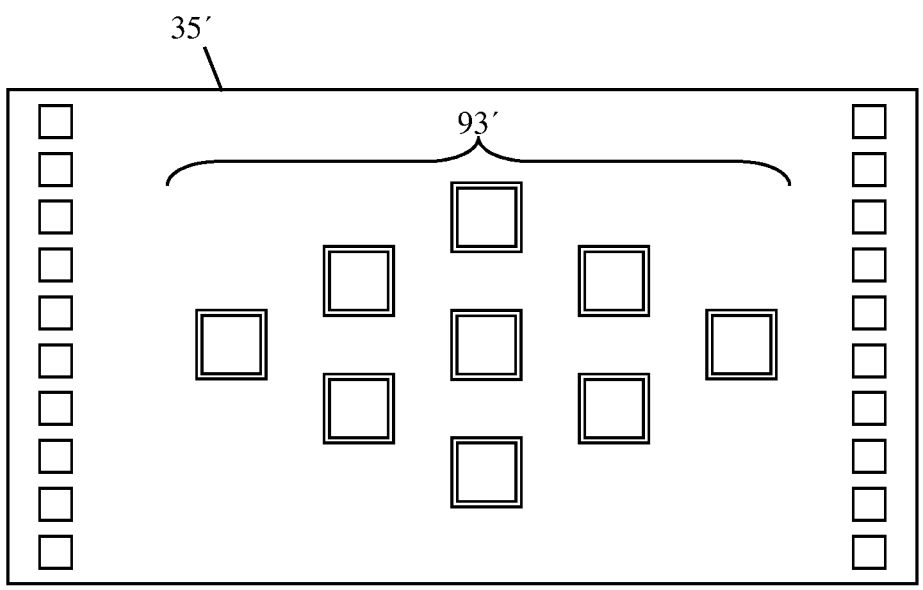

In implementations, the resistor 35 and the substrate contact 93 may be of any desired size and shape. For example, the resistor 35 may be substantially rectangular with a width "Rw" of about 10 μm and a length "Rl" of about 2 μm, and the substrate contact 93 may have a width "SCw" of about 0.5 μm and a length "SCl" of about 0.5 μm. However, the invention is not limited to this exemplary configuration, and any suitable size and shape may be used for the resistor 35 and the substrate contact 93. Moreover, the respective sizes and shapes of the resistor 35 and the substrate contact(s) 93 may be tailored to achieve a particular electrical resistance and heat transfer for the resistor 35. For example, FIG. 12 shows an implementation comprising a substrate contact 93' having an elongated shape parallel to the direction of current flow in the resistor 35'. FIG. 13 shows an implementation comprising a plurality of substrate contacts 93" arranged in a pattern according to predetermined hot-spots in the resistor 35".

Figure 14:
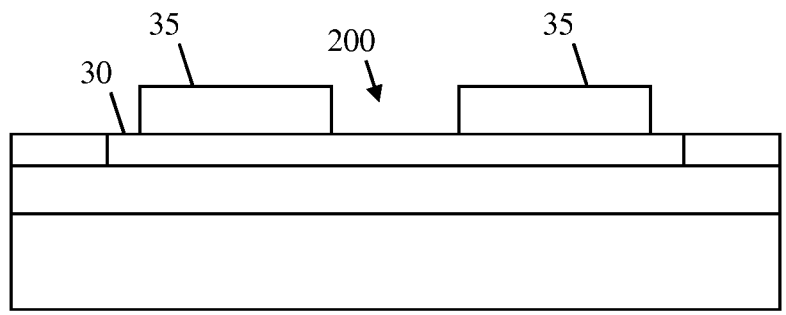
FIGS. 14-20 show processing steps and structures in accordance with additional aspects of the invention.

FIGS. 14-20 show processing steps and respective structures in accordance with additional aspects of the invention in which like reference characters refer to the same features already described herein. In particular, and using the structure of FIG. 2 as a starting point, FIG. 14 shows a resistor trench 200 formed in the resistor 35. The resistor trench 200 may be formed using, for example, masking (e.g., photolithography) and etching (e.g., RIE). In embodiments, the resistor trench 200 extends through the resistor 35 and stops on the STI 30. In embodiments, the resistor trench 200 creates a hole through the resistor 35, but does not bisect the resistor 35.

Figure 15:
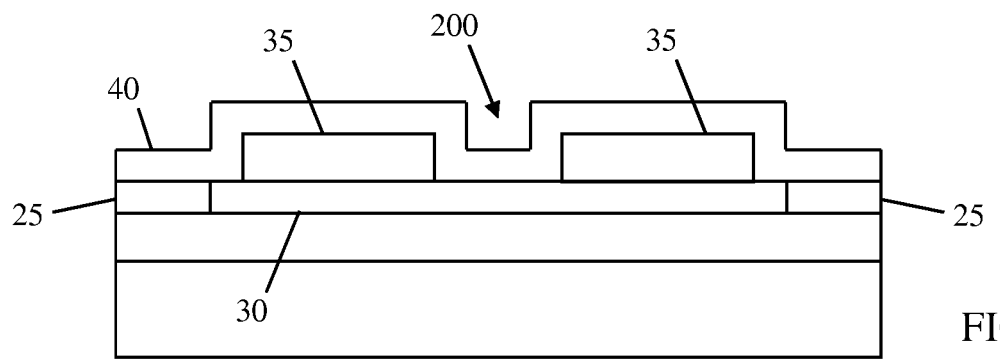

As shown in FIG. 15, the first dielectric layer 40 is formed on the resistor 35 and also and on portions of the semiconductor layer 25 and STI 30, including conformally lining the base and sidewalls of the resistor trench 200. As described previously with respect to FIG. 3, the first dielectric layer 40 may comprise, for example, an oxide film formed by thermal oxidation or CVD and a nitride layer formed by CVD.

Figure 16:
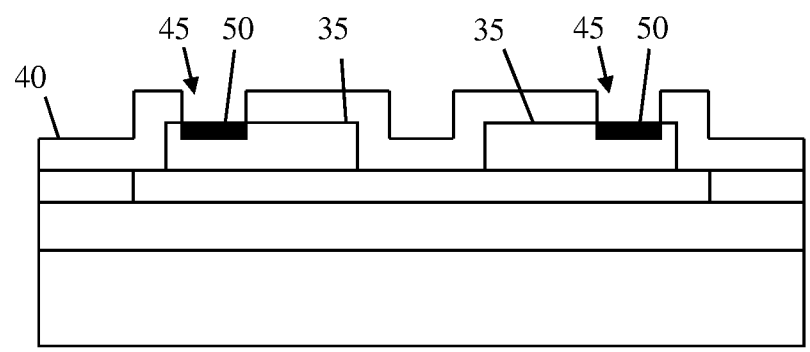

As shown in FIG. 16, holes 45 are formed in the first dielectric layer 40 and silicide contacts 50 are formed on the resistor 35 in the holes 45. The holes 45 and silicide contacts 50 may be formed in the same manner as described with respect to FIG. 3.

Figure 17:
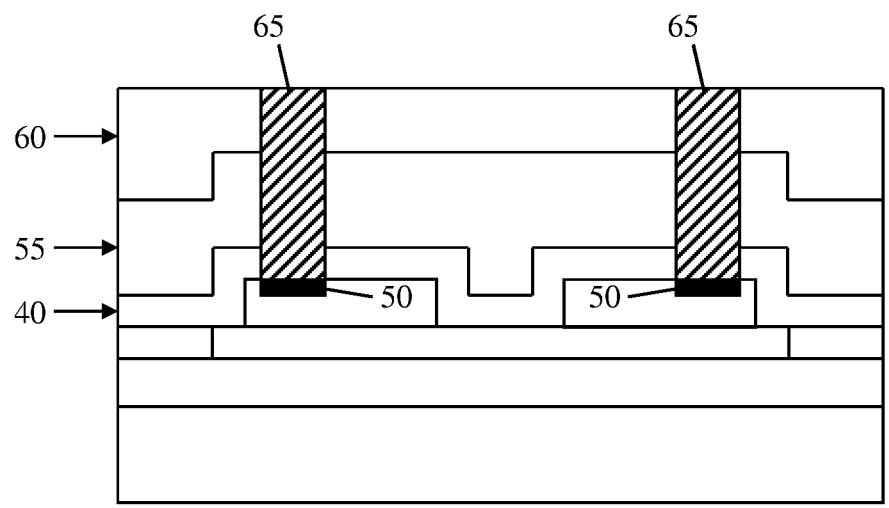

As shown in FIG. 17, a second dielectric layer 55 is formed over the first dielectric layer 40, a third dielectric layer 60 is formed on the second dielectric layer 55, and contacts 65 are formed through layers 60 and 55 and in contact with silicide contacts 50. The second dielectric layer 55, third dielectric layer 60, and contacts 65 may be formed in the same manner as described with respect to FIG. 4. In accordance with aspects of the invention, the second dielectric layer 55 fills the remainder of the resistor trench 200.

Figure 18:
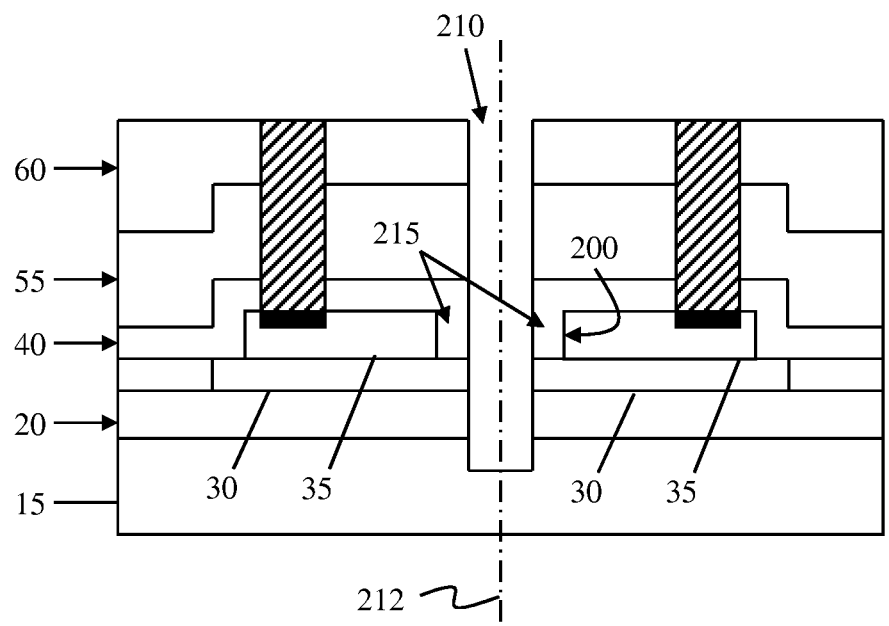

As shown in FIG. 18, a substrate contact trench 210 is formed in the dielectric layers 40, 55, and 60, the resistor 35, the STI 30, the BOX layer 20, and into the substrate 15. The substrate contact trench 210 may be formed using one or more RIE processes, similar to substrate contact trench 70 described with respect to FIG. 5.

In accordance with aspects of the invention, the substrate contact trench 210 is substantially aligned with (e.g., coaxial with) the resistor trench 200 and has a smaller width than the resistor trench 200. For example, the substrate contact trench 210 and the resistor trench 200 may be substantially co-axial along axis 212. In this manner, a collar portion 215 of the first dielectric layer 40 remains on the sidewalls of filled the resistor trench 200. In implementations of the invention, the substrate contact trench 210 and the resistor trench 200 are sized and spatially arranged such that the collar portion 215 has a thickness of about 0.03 μm to about 0.1 μm, although other non-zero dimensions may be used within the scope of the invention.

Figure 19:
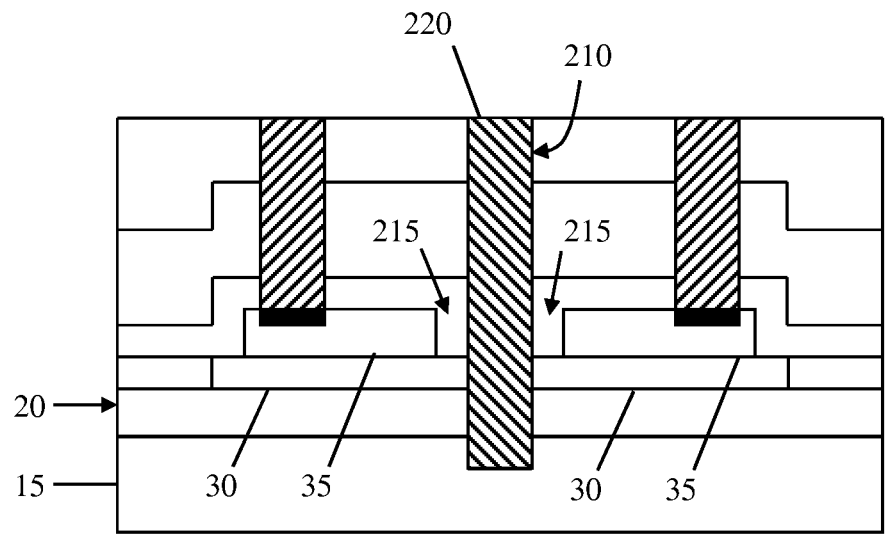

As shown in FIG. 19, a core 220 is formed in the substrate contact trench 210. In embodiments, the core 220 comprises a high thermal conductivity material. For example, the core 220 may be composed of the same material and formed in the same manner as core 90.

In accordance with aspects of the invention, the collar portion 215 surrounds the core 220 and electrically insulates the core 220 from the resistor 35, such that the core 95 does not short the resistor 35. By electrically insulating the core 220 from the resistor 35, the collar portion 215 eliminates the need for forming additional insulator film (e.g., such as insulator film 75) on the sidewalls of the substrate contact trench 210. In this manner, the number of processing steps involved in forming the semiconductor structure may be reduced.

In embodiments, the collar portion 215 has a thickness that is sufficient to provide electrical insulation between the resistor 35 and the core 220, and that is less than the combined thickness of the STI 30 and BOX layer 20. By being less thick (e.g., thinner) than the STI 30 and BOX layer 20, the collar portion 215 provides less thermal resistance than the STI 30 and BOX layer 20, such that heat may flow through the collar portion 215 and core 220 and into the substrate 15.

Figure 20:
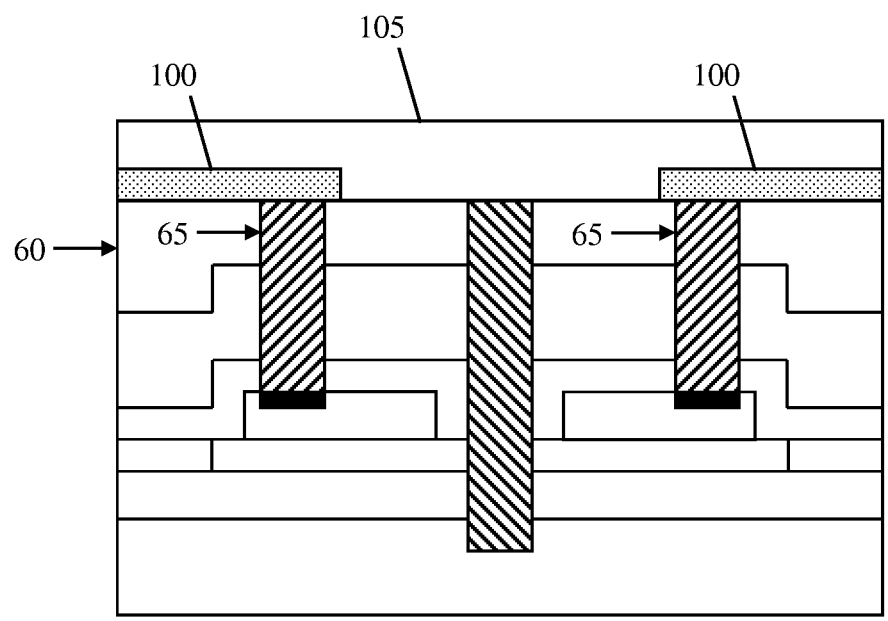

As shown in FIG. 20, metal layer 100 is formed on the third dielectric layer 60 and in contact with the contacts 65, and an interlevel dielectric (ILD) 105 is formed over the entire structure. The metal layer 100 and ILD 105 may be formed in the manner described above with respect to FIG. 10. The segments of the metal layer 100 provide electrical connection to the resistor 35, and the ILD insulates the metal layer 100.

Aspects of the invention have been described with respect to a polysilicon resistor formed on an SOI wafer. The invention is not limited to this particular type of resistor, however, and implementations of the invention may be used with any type of resistor. For example, a substrate contact in accordance with aspects of the invention may be formed through a diffused resistor or a refractory metal resistor. Moreover, the invention is not limited to use with SOI wafers. Instead, aspects of the invention could be used with any type of wafer, including resistors formed in or on a bulk semiconductor material (e.g., silicon) substrate. For example, the resistor used in implementations of the invention may be formed on an insulator layer (e.g., an STI) formed in a bulk silicon substrate.

Figure 21:
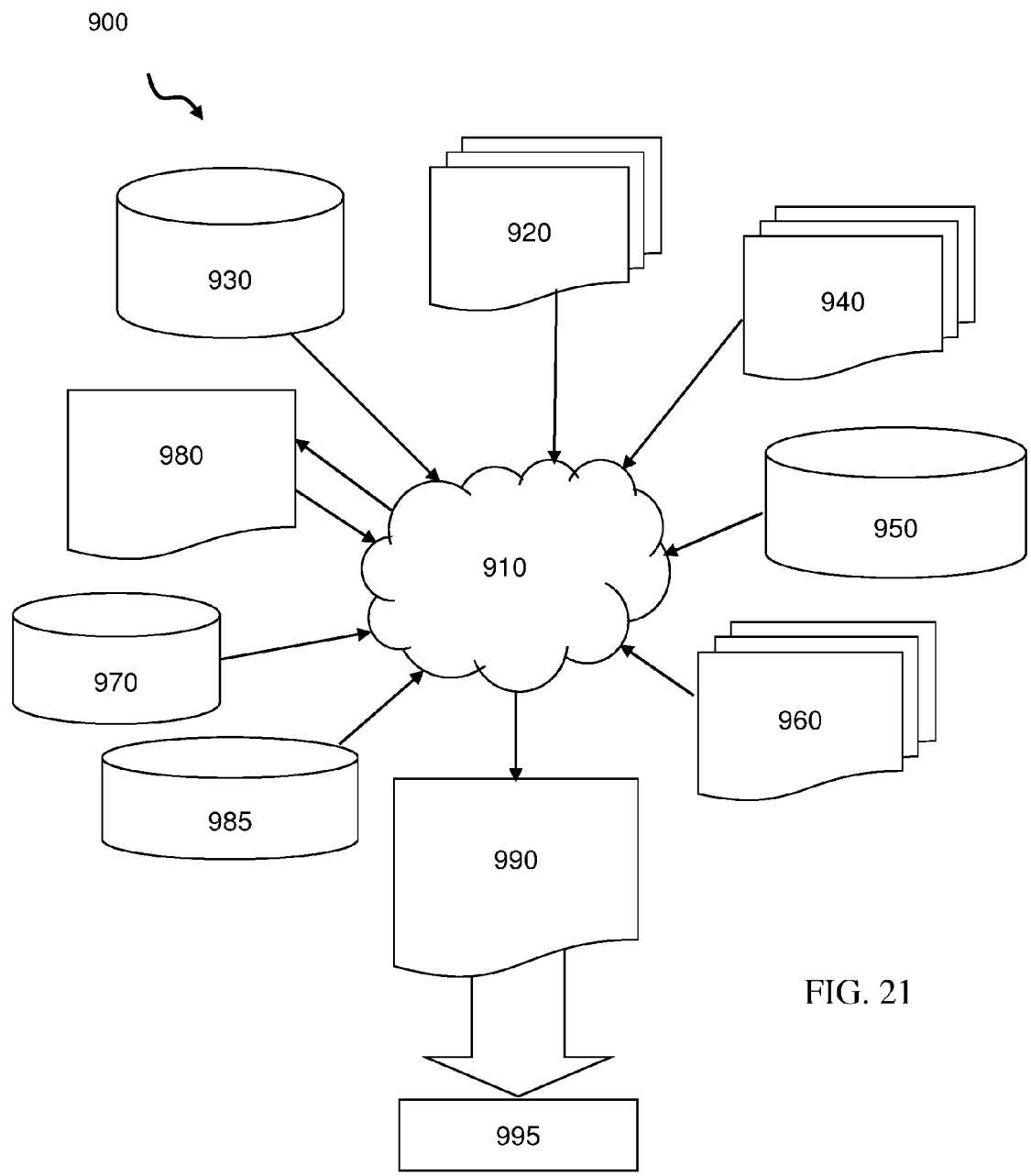
FIG. 21 is a flow diagram of a design process used in semiconductor design, manufacture, and/or test.

FIG. 21 is a flow diagram of a design process used in semiconductor design, manufacture, and/or test. FIG. 21 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-20. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-20. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-20 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-20. In one embodiment, design structure 990 may comprise a compiled, executable HDL simulation model that functionally simulates the devices shown in FIGS. 1-20.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-20. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A semiconductor structure, comprising:
   a resistor on an insulator layer over a substrate;
   at least one dielectric layer over the resistor; and
   a substrate contact extending through the at least one dielectric layer, through the resistor, through the insulator layer, and into the substrate, wherein the substrate contact comprises a high thermal conductivity material.

2. The structure of claim 1, wherein the substrate contact comprises:
   a core composed of the high thermal conductivity material; and
   a liner between the core and the at least one dielectric layer, the resistor, and the insulator layer,
   wherein the liner electrically insulates the core from the resistor.

3. The structure of claim 2, wherein:
   the insulator layer comprises at least one of a shallow trench isolation and a buried oxide layer; and
   the liner has a thickness less than a thickness of the insulator between the resistor and the substrate.

4. The structure of claim 1, wherein:
   the substrate contact comprises a core composed of the high thermal conductivity material; and
   a portion of the at least one dielectric layer is between the core and the resistor and electrically insulates the core from the resistor.

5. The structure of claim 1, further comprising a dielectric material between the high thermal conductivity material and the resistor, wherein a thickness of the dielectric material is less than a thickness of the insulator layer between the resistor and the substrate.

6. The structure of claim 1, wherein:
   a portion of the at least one dielectric layer forms a collar around the high thermal conductivity material; and
   the collar electrically insulates the high thermal conductivity material from the resistor.

7. The structure of claim 1, further comprising:
   first and second contacts at first and second ends of the resistor and extending through the at least one dielectric layer;
   a metal layer comprising segments on the first and second contacts; and
   wherein the substrate contact is electrically insulating from the metal layer.

8. The structure of claim 1, further comprising a plurality of the substrate contacts through the resistor in a pattern based on predetermined hot-spots in the resistor.

9. The structure of claim 1, wherein a size of the resistor and a size of the substrate contact are structured and arranged to achieve a predefined resistance value of the resistor.

10. The structure of claim 1, wherein the at least one dielectric layer comprises:
    a first dielectric layer comprising an oxide film and a nitride layer;
    a second dielectric layer comprising nitride; and
    a third dielectric layer comprising oxide.

* * * * *